(12) United States Patent  
Choi et al.

(10) Patent No.: US 9,099,600 B2  
(45) Date of Patent: Aug. 4, 2015

(54) NITRIDE SEMICONDUCTOR LIGHT-EMITTING ELEMENT HAVING SUPERIOR CURRENT SPREADING EFFECT AND METHOD FOR MANUFACTURING SAME

(75) Inventors: Won-Jin Choi, Seongnam-si (KR); Jung-Won Park, Yongin-si (KR)

(73) Assignee: ILJIN LED CO., LTD., Ansan-Si, Gyeonggi-Do (KR)

( * ) Notice: Subject to any disclaimer, the term of this patent is extended or adjusted under 35 U.S.C. 154(b) by 0 days.

(21) Appl. No.: 14/237,299

(22) PCT Filed: Aug. 2, 2012

(86) PCT No.: PCT/KR2012/006178  
§ 371 (c)(1),  
(2), (4) Date: Feb. 5, 2014

(87) PCT Pub. No.: WO2013/022227  
PCT Pub. Date: Feb. 14, 2013

(65) Prior Publication Data  
US 2014/0191193 A1   Jul. 10, 2014

(30) Foreign Application Priority Data  
Aug. 8, 2011   (KR) .................. 10-2011-0078778

(51) Int. Cl.  
*H01L 27/15*   (2006.01)  
*H01L 29/24*   (2006.01)  
(Continued)

(52) U.S. Cl.  
CPC .............. *H01L 33/14* (2013.01); *H01L 33/325* (2013.01); *H01L 33/06* (2013.01)

(58) Field of Classification Search  
CPC ....... H01L 33/007; H01L 33/14; H01L 33/06; H01L 21/0254

USPC ........... 257/79, 85, 94, 101, 103; 438/22, 24, 438/29, 37, 4  
See application file for complete search history.

(56) References Cited

U.S. PATENT DOCUMENTS 5,693,963 A    12/1997  Fujimoto et al.  
6,810,065 B1 *  10/2004  Naone ........................... 372/96  
(Continued)

FOREIGN PATENT DOCUMENTS

JP    2000101133 A    4/2000  
JP    2008066514 A    3/2008  
(Continued)

OTHER PUBLICATIONS

International Search Report for PCT/KR2012/006178 mailed on Feb. 7, 2013.  
C. H. Seager et al., Role of carbon in GaN, Dec. 1, 2002, 6553-6560, vol. 92, No. 11, Journal of Applied Physics.  
European Search Report dated Mar. 5, 2015.  
Taiwanese Office Action dated Dec. 18, 2014.

*Primary Examiner* — Hsien Ming Lee  
(74) *Attorney, Agent, or Firm* — Lowe Hauptman & Ham, LLP

(57) ABSTRACT

Disclosed are a nitride semiconductor light-emitting element having a superior current spreading effect as a result of using a current spreading part containing current spreading impurities, and a method for manufacturing same. The nitride semiconductor light-emitting element according to the present invention comprises: an n-type nitride layer; a current spreading part, which is formed from nitride comprising current spreading impurities, and which is disposed on the n-type nitride layer; an activation layer disposed on the current spreading part; and a p-type nitride layer disposed on the activation layer, wherein the current spreading impurities comprise carbon (C).

20 Claims, 15 Drawing Sheets

(51) Int. Cl.
*H01L 21/00* (2006.01)
*H01L 33/14* (2010.01)
*H01L 33/32* (2010.01)
*H01L 33/06* (2010.01)

(56) References Cited

U.S. PATENT DOCUMENTS

| | | | |
|---|---|---|---|
| 8,536,615 B1 * | 9/2013 | Driscoll et al. | 257/101 |
| 8,564,014 B2 * | 10/2013 | Sampath et al. | 257/103 |
| 2007/0045655 A1 * | 3/2007 | Song et al. | 257/104 |
| 2007/0194328 A1 | 8/2007 | Komada | |

FOREIGN PATENT DOCUMENTS

| | | |
|---|---|---|
| KR | 100674862 B1 | 1/2007 |
| KR | 1020070027327 A | 3/2007 |
| KR | 100738399 B1 | 7/2007 |
| KR | 1020100027410 A | 3/2010 |
| KR | 100979701 B1 | 9/2010 |
| TW | 201044637 A | 12/2010 |
| TW | 201126755 A | 8/2011 |
| WO | 2007013257 A1 | 2/2007 |

* cited by examiner

NITRIDE SEMICONDUCTOR LIGHT-EMITTING ELEMENT HAVING SUPERIOR CURRENT SPREADING EFFECT AND METHOD FOR MANUFACTURING SAME

TECHNICAL FIELD

The present invention relates to a nitride semiconductor light emitting device and a method for manufacturing the same and, more particularly, to a nitride semiconductor light emitting device, which provides excellent current spreading effects through a current spreading part containing current spreading impurities, and a method for manufacturing the same.

BACKGROUND ART

Conventional nitride semiconductor devices include, for example, GaN-based nitride semiconductor devices, which are applied to blue or green light emitting devices (LEDs), high speed switching and high output devices, such as MESFET, HEMT, and the like.

One example of such a typical GaN-based nitride semiconductor light emitting device includes a nitride semiconductor light emitting device 10 having an activation layer 15 of a multi-quantum well structure. Such a typical nitride semiconductor light emitting device 10 includes a sapphire substrate 11, an n-type nitride layer 12, an activation layer 15, and a p-type nitride layer 17. In addition, a transparent electrode layer 18 and a p-side electrode 19b are sequentially formed on an upper surface of the p-type nitride layer 17, and an n-side electrode 19a is formed on an exposed surface of the n-type nitride semiconductor layer 12.

Such a typical GaN-based nitride semiconductor light emitting device emits light through recombination of electrons and holes in the activation layer 15. In order to improve luminous efficacy of the activation layer 15, the amount of n-type dopants in the n-type nitride layer 12 or the amount of p-type dopants in the p-type nitride layer 17 are increased to increase an inflow amount of electrons or holes into the activation layer 15, as disclosed in Korean Patent Laid-open Publication No. 2010-0027410 (Mar. 11, 2010).

However, when the amount of n-type dopants in the n-type nitride layer 12 or the amount of p-type dopants in the p-type nitride layer 17 is increased, the nitride semiconductor device suffers from significant deterioration in luminous efficacy due to uneven current spreading.

Specifically, since an excess of electrons flows from the n-type nitride layer 12 into some areas of the activation layer 15 and holes generated in the p-type nitride layer 17 are not efficiently moved into the activation layer 15, some area of the activation layer 15 has high current density, whereas the other area of the activation layer 15 have low current density.

Therefore, such a typical GaN-based nitride semiconductor light emitting device is required to have improved luminous efficacy through uniform current spreading in the activation layer 15.

DISCLOSURE

Technical Problem

One aspect of the present invention is to provide a nitride semiconductor light emitting device which provides excellent current spreading effects through a current spreading part containing an impurity for current spreading.

Another aspect of the present invention is to provide a method capable of easily manufacturing the nitride semiconductor light emitting device.

Technical Solution

In accordance with one aspect of the present invention, a nitride semiconductor light emitting device includes: an n-type nitride layer; a current spreading part formed of a nitride including current spreading impurities and disposed on the n-type nitride layer; an activation layer disposed on the current spreading part; and a p-type nitride layer disposed on the activation layer, wherein the current spreading impurities include carbon (C).

In accordance with another aspect of the present invention, a nitride semiconductor light emitting device includes: an n-type nitride layer; a current spreading part formed of a nitride including current spreading impurities and disposed on the n-type nitride layer; an activation layer formed on the current spreading part; and a p-type nitride layer formed on the activation layer, wherein the current spreading impurities include carbon (C), and the current spreading part is a nitride layer having a free hole concentration ranging from $1 \times 10^{13}$ to $5 \times 10^{16}/cm^3$ and guiding holes introduced into the activation layer.

In accordance with a further aspect of the present invention, a nitride semiconductor light emitting device includes: an n-type nitride layer; a current spreading part formed on the n-type nitride layer; an activation layer formed on the current spreading part; and a p-type nitride layer formed on the activation layer, wherein the current spreading part is a nitride layer containing a higher carbon concentration than other layers.

In accordance with yet another aspect of the present invention, a nitride semiconductor light emitting device includes: an n-type nitride layer; a current spreading part formed on the n-type nitride layer and including current spreading impurities and a silicon (Si) dopant; an activation layer formed on the current spreading part; and a p-type nitride layer formed on the activation layer, wherein the current spreading impurities include carbon (C), and the current spreading part has a multilayer structure formed by alternately stacking a layer having a higher carbon (C) concentration than silicon (Si) concentration and a layer having a higher silicon (Si) concentration than carbon (C) concentration.

In accordance with yet another aspect of the present invention, a method for manufacturing a nitride semiconductor light emitting device includes: forming an n-type nitride layer on a substrate; forming a current spreading part on the n-type nitride layer; forming an activation layer on the current spreading part; and forming a p-type nitride layer on the activation layer, wherein the current spreading part is formed of a nitride including current spreading impurities, and the current spreading impurities include carbon (C).

In accordance with yet another aspect of the present invention, a method for manufacturing a nitride semiconductor light emitting device includes: forming an n-type nitride layer on a substrate; forming a current spreading part of a multilayer structure containing current spreading impurities and a silicon (Si) dopant on the n-type nitride layer; forming an activation layer on the current spreading part; and forming a p-type nitride layer on the activation layer, wherein the current spreading impurities include carbon (C), and the current spreading part has a multilayer structure formed by alternately stacking a layer having a higher carbon (C) concentration than silicon (Si) concentration and a layer having a higher silicon (Si) concentration than carbon (C) concentration.

Advantageous Effects

According to embodiments of the present invention, a nitride semiconductor light emitting device includes a current spreading part containing current spreading impurities, whereby electrons and holes can be efficiently introduced into and spread in the activation layer, thereby improving luminous efficacy through increase in light emitting area by current spreading.

In a method for manufacturing a nitride semiconductor light emitting device according to embodiments of the invention, a current spreading part is easily formed by adjusting the concentration of the current spreading impurities and the concentration of a silicon (Si) dopant, thereby providing a nitride semiconductor light emitting device having an increased light emitting area and improved luminous efficacy through current spreading.

BEST MODE

Hereinafter, embodiments of the present invention will be described in more detail with reference to the accompanying drawings. Here, it should be understood that the present invention may be modified in various ways and is not limited to the following embodiments.

Figure 1:
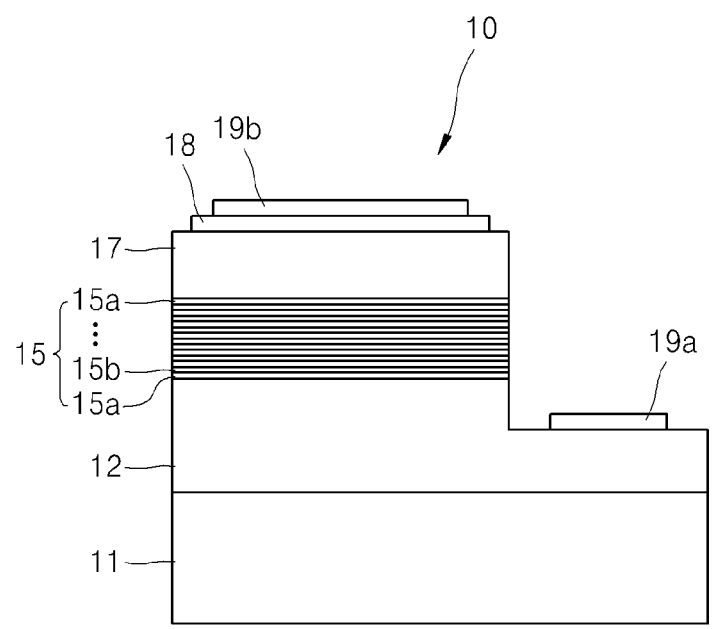
FIG. 1 is a sectional view of a typical nitride semiconductor light emitting device.
Figure 2:
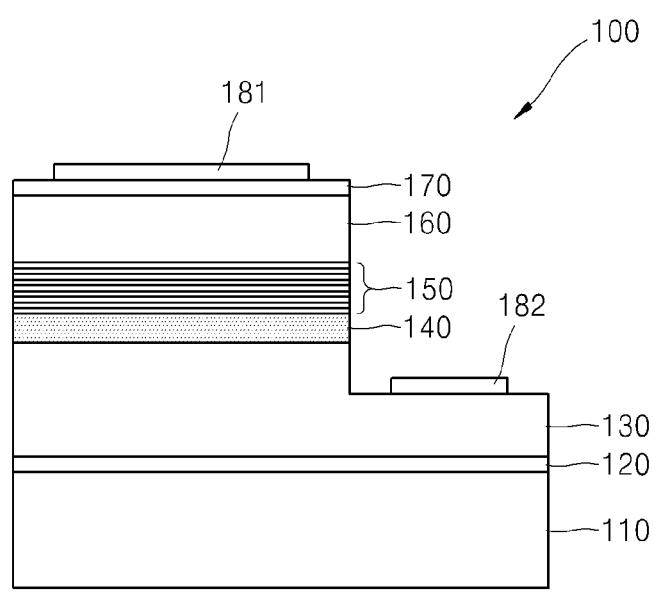
FIG. 2 is a sectional view of a lateral type nitride semiconductor light emitting device according to a first embodiment of the present invention.

Referring to FIG. 2, a nitride semiconductor light emitting device 100 according to a first embodiment of the invention includes, from bottom to top, a substrate 110, a buffer layer 120, an n-type nitride layer 130, a current spreading part 140, an activation layer 150, a p-type nitride layer 160, a transparent electrode layer 170, a p-side electrode 181, and an n-side electrode 182.

The buffer layer 120 may be formed of, for example, AlN or GaN to relieve lattice mismatch between the substrate 110 and the n-type nitride layer 130.

The n-type nitride layer 130 is formed on an upper surface of the substrate 110 or the buffer layer 120. Here, the n-type nitride layer 130 may have a stack structure, which is formed by alternately stacking a first layer formed of Si-doped n-type AlGaN and a second layer formed of undoped GaN. Although the n-type nitride layer 130 may be obtained by growing a single n-type nitride layer, the stack structure of the first and second layers can act as a carrier restriction layer having good crystallinity and free from cracks.

The current spreading part 140 is disposed between the n-type nitride layer 130 and the activation layer 150, and may be formed of a nitride layer containing current spreading impurities to allow electrons and holes introduced into the activation layer 150 to spread therein instead of crowding at a certain region of the activation layer 150. Here, the current spreading impurities of the current spreading part 140 may include carbon (C), which acts as an insulator for current spreading. In this case, the impurities may include carbon alone or a combination of carbon and at least one of Group XIV elements, such as germanium (Ge), tin (Sn), lead (Pb), and the like. In the current spreading part 140, such current spreading impurities may be doped alone. Alternatively, the current spreading impurities may be doped together with a silicon (Si) dopant. In this case, the silicon (Si) dopant may be provided thereto by delta doping, by which the concentration of the silicon dopant periodically varies.

Specifically, when the current spreading part 140 is formed of a carbon nitride layer such as GaN:C, which contains carbon (C) as the current spreading impurities, the carbon (C) concentration ranges from $1\times10^{16}$ atoms/cm$^3$ to $1\times10^{18}$ atoms/cm$^3$, and a total thickness of the current spreading part 140 may be inversely proportional to the carbon concentration and may range from 500 Å to 5000 Å.

In addition, the current spreading part 140 may have a higher carbon (C) concentration than the carbon concentration in the p-type nitride layer 160 and the activation layer 150.

The thickness of the current spreading part 140 is inversely proportional to the carbon (C) concentration, and thus a higher carbon (C) concentration can cause a smaller thickness of the current spreading part 140.

Particularly, when the current spreading part 140 has a thickness of less than 500 Å with reference to the carbon (C) concentration, the current spreading part 140 cannot provide a current spreading function. On the other hand, when the current spreading part 140 has a thickness of greater than 5000 Å with reference to the carbon (C) concentration, the current spreading part 140 acts as a high resistance layer and thus requires increase in application voltage to 0.4V or more.

The current spreading part 140 may act as a p$^-$ layer, which prevents excess inflow of electrons into a certain area of the activation layer 150 while guiding a larger amount of holes into the activation layer 150. The p$^-$ layer corresponds to a layer exhibiting slight p-type characteristics and may be a nitride layer having a free hole concentration of about $1\times10^{13}$/cm$^3$ to about $5\times10^{16}$/cm$^3$.

The activation layer 150 is placed between the current spreading part 140 and the p-type nitride layer 160 and may have a single quantum well structure or a multi-quantum well structure. In this embodiment, the activation layer 150 may have a multi-quantum well structure wherein a quantum barrier layer is formed of an Al-containing nitride, for example, AlGaInN and a quantum well layer is formed of, for example, InGaN. The activation layer 150 having such a multi-quantum well structure formed by repeatedly stacking such quantum barrier layers and quantum well layers can suppress spontaneous polarization due to stress and deformation.

The p-type nitride layer 160 may be formed in a stack structure by alternately stacking, for example, a first layer formed of p-type AlGaN doped with Mg and a second layer formed of p-type GaN doped with Mg. In addition, like the n-type nitride layer 130, although the p-type nitride layer 160 may be formed by growing a single p-type nitride layer, the stack structure of the first and second layers can act as a carrier restriction layer having good crystallinity and free from cracks.

The transparent electrode layer 170 is disposed on an upper surface of the p-type nitride layer 160. Such a transparent electrode layer 170 is formed of a transparent conductive oxide, and may include an element, such as In, Sn, Al, Zn, Ga, and the like. For example, the transparent electrode layer 170 may be formed of ITO, CIO, ZnO, NiO, $In_2O_3$, or the like.

In such a nitride semiconductor light emitting device 100 according to the first embodiment, the current spreading part 140 is disposed between the n-type nitride layer 130 and the activation layer 150, whereby resistance at an interface between the n-type nitride layer 130 and the current spreading part 140 is lower than resistance in a vertical direction from the n-type nitride layer 130 to the current spreading part 140. Here, since electrons flows to a lower resistance side, electrons emitted from the n-type nitride layer 130 flow into the activation layer 150 while spreading along the interface between the n-type nitride layer 130 and the current spreading part 140.

Accordingly, in the nitride semiconductor light emitting device 100 according to this embodiment, the current spreading part 140 formed of the nitride layer containing carbon (C) allows electrons and holes to be efficiently introduced into and spread in the activation layer 150, whereby a light emitting area is increased, thereby improving luminous efficacy.

Next, a method for manufacturing the nitride semiconductor light emitting device 100 according to the first embodiment will be described with reference to FIGS. 3 to 7.

Figure 3:
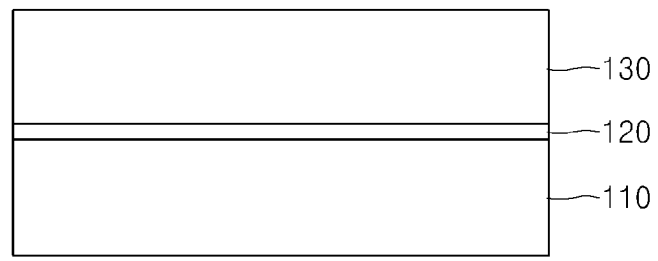
FIG. 3 to FIG. 7 are sectional views illustrating a method for manufacturing the lateral type nitride semiconductor light emitting device according to the first embodiment of the present invention.

Referring to FIG. 3, in the method for manufacturing the nitride semiconductor light emitting device 100 according to the first embodiment, a buffer layer 120 and an n-type nitride layer 130 are sequentially grown on an upper surface of a substrate 110.

The buffer layer 120 may be optionally formed on an upper surface of the substrate 110 to relieve lattice mismatch between the substrate 110 and the n-type nitride layer 130. Here, the buffer layer 120 may be formed of, for example, AlN or GaN.

The n-type nitride layer 130 may be formed as an n-GaN layer. The n-type nitride layer 130 may be formed by growing the n-GaN layer while supplying silane gas containing n-type dopants, for example, $NH_3$, trimethylgallium (TMG), and Si.

Figure 4:
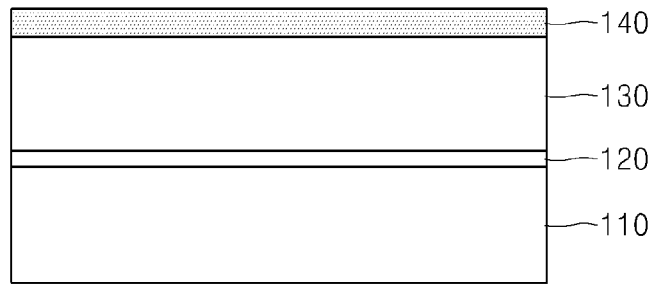

After the n-type nitride layer 130 is formed, a current spreading part 140 formed of a nitride containing current spreading impurities are formed on an upper surface of the n-type nitride layer 130, as shown in FIG. 4.

Specifically, the current spreading part 140 may be formed of a nitride containing carbon as the current spreading impurities by a vapor epitaxy growth process, such as atomic layer epitaxy (ALE), atmospheric pressure chemical vapor deposition (APCVD), plasma enhanced chemical vapor deposition (PECVD), rapid thermal chemical vapor deposition (RTCVD), ultrahigh vacuum chemical vapor deposition (UHVCVD), low pressure chemical vapor deposition (LPCVD), metal organic chemical vapor deposition (MOCVD), and the like.

For example, the current spreading part 140 may be formed of a nitride layer containing carbon (C) as the current spreading impurities, specifically, a carbon containing nitride layer, such as GaN:C, using $NH_3$, trimethylgallium (TMG), and DMHY (dimethylhydrazine) by MOCVD. In the current spreading part 140, such a current spreading impurity may be doped alone, or together with a silicon (Si) dopant. In this case, the silicon (Si) dopant may be doped in a delta doping form.

Here, when the current spreading part is formed of a carbon doped nitride such as GaN:C, the carbon (C) concentration may range from $1\times10^{16}$ atoms/cm$^3$ to $1\times10^{18}$ atoms/cm$^3$, and a total thickness of the current spreading part 140 may be inversely proportional to the carbon (C) concentration and may range from 500 Å to 5000 Å. In addition, the current spreading part 140 may have a higher carbon (C) concentration than the carbon concentration in the p-type nitride layer 160 and the activation layer 150.

Figure 5:
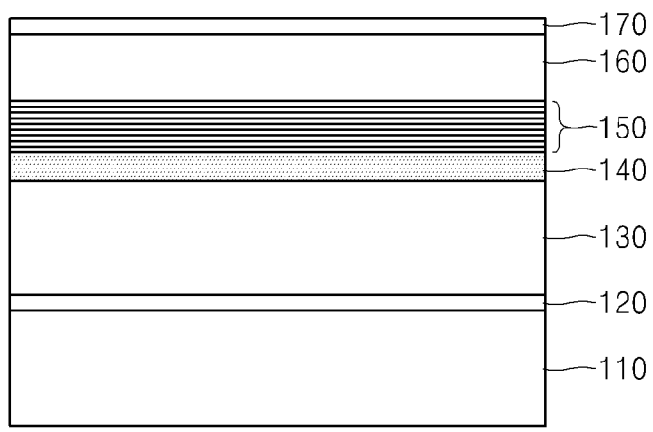

After the current spreading part 140 is formed, an activation layer 150, a p-type nitride layer 160 and a transparent electrode layer 170 may be sequentially formed on an upper surface of the current spreading part 140, as shown in FIG. 5.

The activation layer 150 may have a single quantum well structure or a multi-quantum well structure in which quantum well layers and quantum barrier layers are alternately stacked one above another. In this embodiment, the activation layer 150 may have a multi-quantum well structure wherein the quantum barrier layers may be formed of, for example, an Al-containing quaternary nitride layer of AlGaInN and the quantum well layers may be formed of, for example, InGaN.

The p-type nitride layer 160 may be formed in a stack structure by alternately stacking, for example, a first layer formed of p-type AlGaN doped with Mg and a second layer formed of p-type GaN doped with Mg. In addition, like the n-type nitride layer 130, the p-type nitride layer 160 may be formed by growing a single p-type nitride layer.

The transparent electrode layer 170 is formed of a transparent conductive oxide, and may include an element, such as In, Sn, Al, Zn, Ga, and the like. For example, the transparent electrode layer 170 may be formed of at least one of ITO, CIO, ZnO, NiO, and $In_2O_3$.

Figure 6:
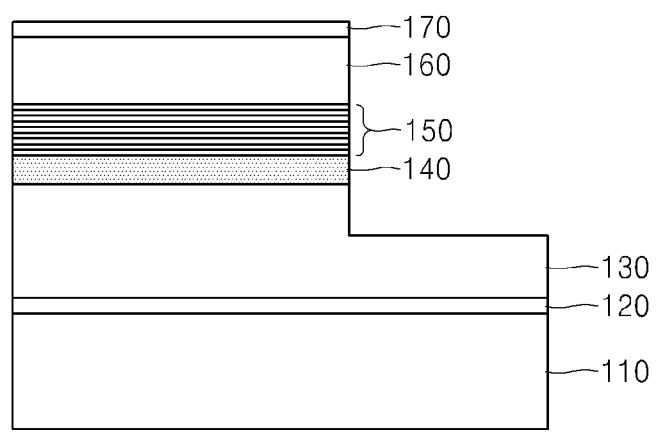

After the transparent electrode layer 170 is formed, one region of the n-type nitride layer 130 may be exposed through lithographic etching and cleaning from the transparent electrode layer 170 to one region of the n-type nitride layer 130, as shown in FIG. 6.

Figure 7:
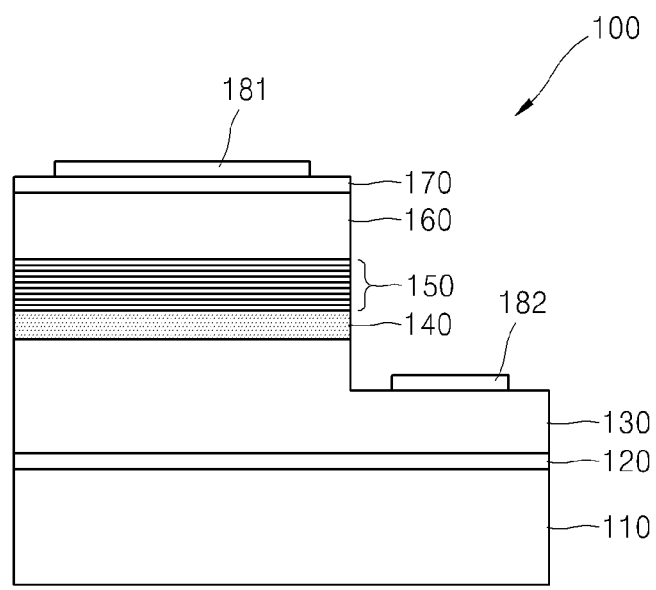

After one region of the n-type nitride layer 130 is exposed, a p-side electrode 181 is formed on an upper surface of the transparent electrode layer 170 and an n-side electrode 182 is formed on the exposed region of the n-type nitride layer 130, as shown in FIG. 7.

In the method for manufacturing the nitride semiconductor light emitting device 100 according to the first embodiment, the current spreading part 140 having a desired concentration of the current spreading impurities may be formed to a desired thickness through vapor epitaxy growth.

Accordingly, the method for manufacturing the nitride semiconductor light emitting device 100 according to the first embodiment allows easy formation of the current spreading part 140 having a desired concentration of the current spreading impurities and a desired thickness.

Figure 8:
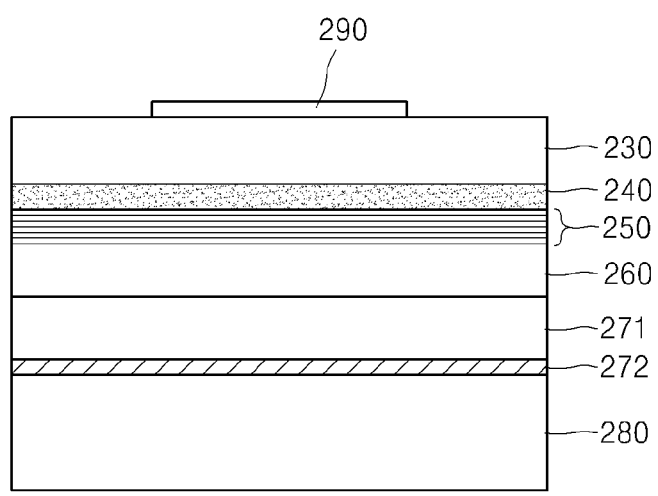
FIG. 8 is a sectional view of a vertical type nitride semiconductor light emitting device according to a second embodiment of the present invention.

Hereinafter, a vertical type nitride semiconductor light emitting device according to a second embodiment invention will be described with reference to FIG. 8. FIG. 8 is a sectional view of the vertical type nitride semiconductor light emitting device according to the second embodiment of the present invention. Here, detailed descriptions of components and functions of the nitride semiconductor light emitting device apparent to those skilled in the art will be omitted for clarity.

Referring to FIG. 8, the vertical type nitride semiconductor light emitting device according to the second embodiment includes, in an upward direction, a p-side electrode support layer 280, a reflective layer 272, an ohmic contact layer 271, a p-type nitride layer 260, an activation layer 250, a current spreading part 240, an n-type nitride layer 230, and an n-side electrode 290.

The p-side electrode support layer 280 is a conductive support member and is required to ensure sufficient dissipation of heat generated upon operation of the light emitting device while acting as a p-side electrode. Particularly, the p-side electrode support layer 280 is required to have mechanical strength and support layers to be formed on or above the support layer during a manufacturing process including a scribing or breaking process.

Thus, the p-side electrode support layer 280 may be formed of a metal having good thermal conductivity, such as gold (Au), copper (Cu), silver (Ag), aluminum (Al), and the like. Alternatively, the p-side electrode support layer 280 may be formed of alloys, which have crystal structures and crystal lattice parameters similar to these metals to minimize generation of internal stress upon alloying and have mechanical strength. For example, the p-side electrode support layer 280 may be formed of alloys including a light weight metal, such as nickel (Ni), cobalt (Co), platinum (Pt), palladium (Pd), and the like.

The reflective layer 272 may be optionally formed on an upper surface of the p-side electrode support layer 280 and may be formed of a metallic material having high reflectivity to reflect light upwards when emitted from the activation layer 250.

The ohmic contact layer 271 is formed of a metal, such as nickel (Ni) or gold (Au), or a nitride containing such a metal on an upper surface of the reflective layer 272, and forms ohmic contact having low resistance. Here, when the ohmic contact layer 271 is formed of a metal such as nickel (Ni) or gold (Au), the ohmic contact layer 271 provides a reflecting function, and thus, the reflective layer 272 may be omitted.

The current spreading part 240 is a nitride layer containing current spreading impurities in a direction to a lower side of the n-type nitride layer 230, and contains carbon and a silicon dopant.

In the current spreading part 240, the current spreading impurities including carbon may be contained in a concentration range from $1\times10^{16}$ atoms/cm$^3$ to $1\times10^{18}$ atoms/cm$^3$.

Like the current spreading part 140 shown in FIG. 2, the current spreading part 240 may improve current distribution along the interface between the n-type nitride layer 230 and the current spreading part 240, that is, horizontal current distribution.

When the horizontal current distribution is improved, the vertical type nitride semiconductor light emitting device has even current density into the activation layer 250 to provide a large light emitting area, thereby improving luminous efficacy.

Such a vertical type nitride semiconductor light emitting device may be formed by a typical method for manufacturing a vertical type nitride semiconductor light emitting device. In this case, the vertical type nitride semiconductor light emitting device may be formed by equipment (not shown) for vapor epitaxy growth through a vapor epitaxy growth process using a mixture of a carbon (C)-containing gas and a silicon (Si)-containing gas.

In this case, the current spreading part 240 of the vertical type nitride semiconductor light emitting device may be formed by the same process as that of the current spreading part 140 according to the first embodiment of the invention.

Thus, the second embodiment of the invention may provide a vertical type nitride semiconductor light emitting device, which has improved luminous efficacy through an increased light emitting area by the current spreading part 240 allowing electrons and holes to be efficiently introduced into and spread in the activation layer 250.

Next, a lateral type nitride semiconductor light emitting device 300 according to a third embodiment of the invention will be described with reference to FIG. 9.

Figure 9:
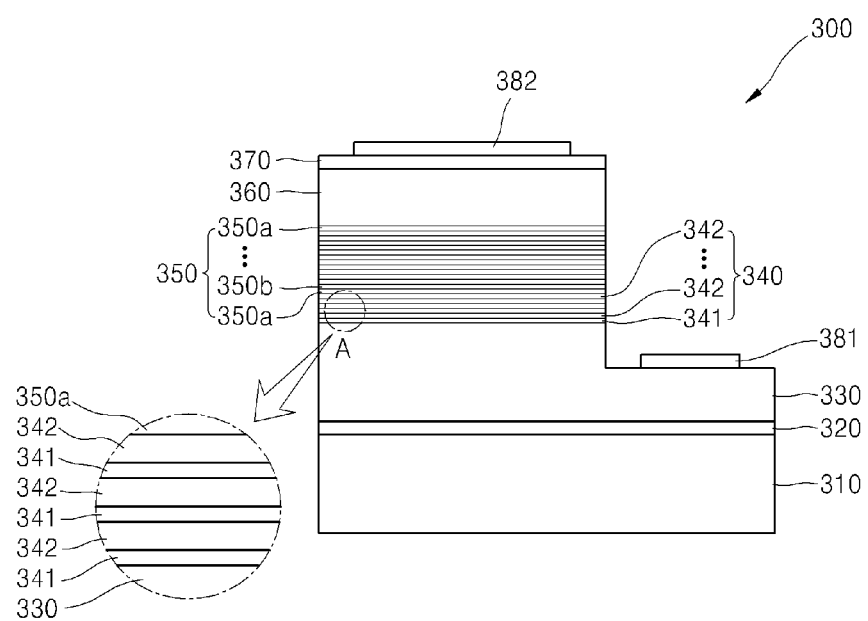
FIG. 9 is a sectional view of a lateral type nitride semiconductor light emitting device according to a third embodiment of the present invention.

Referring to FIG. 9, the nitride semiconductor light emitting device 300 according to the third embodiment includes, from bottom to top, a substrate 310, a buffer layer 320, an n-type nitride layer 330, a current spreading part 340 of a stack structure, an activation layer 350, a p-type nitride layer 360, a transparent electrode layer 370, a p-side electrode 382, and an n-side electrode 381.

The buffer layer 320 may be optionally formed on the upper surface of the substrate 310 to relieve lattice mismatch between the substrate 310 and the n-type nitride layer 330. Here, the buffer layer 320 may be formed of, for example, AlN or GaN.

The n-type nitride layer 330 is formed on an upper surface of the substrate 310 or the buffer layer 320. In this embodiment, the n-type nitride layer 330 may have a stack structure formed by alternately stacking a first layer formed of Si-doped n-type AlGaN and a second layer formed of undoped GaN. Although the n-type nitride layer 330 may be obtained by growing a single n-type nitride layer, the stack structure of the first and second layers can act as a carrier restriction layer having good crystallinity and free from cracks.

The current spreading part 340 is disposed between the n-type nitride layer 330 and the activation layer 350, and may be formed of a nitride layer containing current spreading impurities to allow electrons and holes introduced into the activation layer 350 to spread therein instead of crowding at a certain region of the activation layer 350.

The current spreading part 340 has a stack structure containing current spreading impurities in a direction to an upper surface of the n-type nitride layer 330. As shown in FIG. 9, the current spreading part 340 may have a stack structure formed by stacking, three times, first diffusive layers 341 formed of a nitride layer having a carbon (C) concentration higher than silicon (Si) concentration and second diffusive layers 342 having a silicon (Si) concentration higher than carbon (C) concentration.

Of course, the stack structure of the current spreading part 340 may be obtained by stacking the first diffusive layer 341 and the second diffusive layer 342 once, or by stacking the first diffusive layers 341 and the second diffusive layers 342 plural times.

Here, the current spreading part 340 may have a carbon (C) concentration of $1\times10^{16}$ atoms/cm$^3$ to $1\times10^{18}$ atoms/cm$^3$, and a total thickness of, for example, 500 Å to 5000 Å.

When the carbon concentration or total thickness of the first diffusive layer 341 and the second diffusive layer 342 is less than the above range, the first diffusive layer 341 and the second diffusive layer 342 cannot provide a current spreading function. Further, when the carbon concentration or total thickness of the first diffusive layer 341 and the second diffusive layer 342 is greater than the above range, the first diffusive layer 341 and the second diffusive layer 342 act as high resistance layers and require increase of application voltage to 3.4V or more.

In this way, the stack structure of the first diffusive layer 341 and the second diffusive layer 342 has alternating concentrations of carbon (C) and the silicon (Si) dopant. That is, the first diffusive layer 341, which has a higher carbon (C)

concentration than the silicon (Si) concentration, and the second diffusive layer 342, which has a higher silicon (Si) concentration than the carbon (C) concentration, are alternately stacked one above another. As a result, resistance in an upward direction from the current spreading part 340 to the activation layer 350 increases in proportion to the number of first diffusive layers 341 having a high carbon (C) concentration.

However, resistance at an interface between the first diffusive layer 341 and the second diffusive layer 342 is lower than resistance in the upwardly vertical direction from the current spreading part 340 to the activation layer 350. Here, since electrons flows to a lower resistance side, electrons emitted from the n-type nitride layer 330 flows into the activation layer 350 while spreading along the interface between the first diffusive layer 341 and the second diffusive layer 342.

Accordingly, electron spreading efficiency along the interface between the first diffusive layer 341 and the second diffusive layer 342, that is, horizontal current spreading efficiency, is improved. In this way, as the horizontal current spreading efficiency is improved, electrons can be uniformly introduced into the activation layer 350. Such uniform inflow of electrons into the activation layer 350 provides an increased light emitting area, thereby improving luminous efficacy.

Further, as the current spreading part 340 has improved horizontal current spreading efficiency, operating voltage of the nitride semiconductor light emitting device 300 can be reduced from 3.4V to 3.1V.

Further, the current spreading part 340 may act as a layer, which prevents excess inflow of electrons into a certain area of the activation layer 350 while guiding a greater amount of holes into the activation layer 350.

The activation layer 350 is placed on an upper surface of the current spreading part 340 and may have a single quantum well structure or a multi-quantum well structure. In this embodiment, the activation layer 350 may have a multi-quantum well structure wherein a quantum barrier layer 350a is formed of an Al-containing nitride, for example, AlGaInN and a quantum well layer 350b is formed of, for example, InGaN. The activation layer 350 having such a multi-quantum well structure formed by repeatedly stacking such quantum barrier layers 350a and quantum well layers 350b can suppress spontaneous polarization due to stress and deformation.

The p-type nitride layer 360 may be formed in a stack structure by alternately stacking, for example, a first layer formed of p-type AlGaN doped with Mg and a second layer formed of p-type GaN doped with Mg. In addition, like the n-type nitride layer 330, although the p-type nitride layer 360 may be obtained by growing a single p-type nitride layer, the stack structure of the first and second layers can act as a carrier restriction layer having good crystallinity and free from cracks.

The transparent electrode layer 370 is disposed on an upper surface of the p-type nitride layer 360. Such a transparent electrode layer 370 is formed of a transparent conductive oxide, and may include an element such as In, Sn, Al, Zn, Ga, and the like. For example, the transparent electrode layer 370 may be formed of at least one selected from among ITO, CIO, ZnO, NiO, and $In_2O_3$.

In such a nitride semiconductor light emitting device 300 according to the third embodiment of the invention, the current spreading part 340 is formed between the n-type nitride layer 330 and the activation layer 350 to allow electric current to spread in the activation layer 350 without crowding at a certain region.

Accordingly, the nitride semiconductor light emitting device 300 according to the third embodiment of the invention allows electrons and holes to be efficiently introduced into and spread in the activation layer 350 using the current spreading part 340, which has the stack structure of the first diffusive layer 341 having a higher carbon (C) concentration and the second diffusive layer 342 having a higher concentration of the silicon (Si) dopant. By such current spreading, the nitride semiconductor light emitting device 300 has an increased light emitting area, thereby providing improved luminous efficacy.

Hereinafter, a method for manufacturing the nitride semiconductor light emitting device 300 according to the third embodiment will be described with reference to FIGS. 10 to 13.

Figure 10:
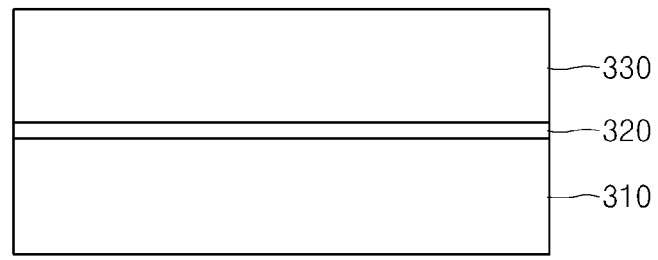
FIG. 10 to FIG. 13 are sectional views illustrating a method for manufacturing the lateral type nitride semiconductor light emitting device according to the third embodiment of the present invention.

Referring to FIG. 10, in the method for manufacturing the nitride semiconductor light emitting device 300 according to the third embodiment, a buffer layer 320 and an n-type nitride layer 330 are sequentially grown on an upper surface of a substrate 310.

The buffer layer 320 is optionally formed on an upper surface of the substrate 310 to relieve lattice mismatch between the substrate 310 and the n-type nitride layer 330. Here, the buffer layer 320 may be formed of, for example, AlN or GaN.

The n-type nitride layer 330 may be formed as an n-GaN layer. The n-type nitride layer 330 may be formed by growing the n-GaN layer while supplying a silane gas containing n-type dopants, for example, $NH_3$, trimethylgallium (TMG), and Si.

Figure 11:
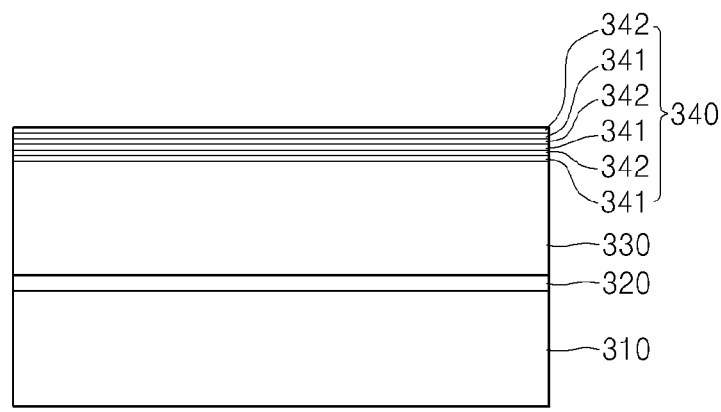

After the n-type nitride layer 330 is formed, a current spreading part 340 having a stack structure formed by repeatedly stacking first diffusive layers 341 and second diffusive layers 342 is formed on an upper surface of the n-type nitride layer 330, as shown in FIG. 11.

The current spreading part 340 contains current spreading impurities including carbon, and may be formed to a thickness of 500 Å to 5000 Å by alternately stacking plural times the first diffusive layers 341 formed of a nitride layer having a carbon (C) concentration higher than silicon (Si) dopant concentration and the second diffusive layers 342 having a silicon (Si) dopant concentration higher than carbon (C) concentration.

Here, the first diffusive layer 341 and the second diffusive layer 342 may be formed in-situ by equipment (not shown) for vapor epitaxy growth through a vapor epitaxy growth process, such as ALE, APCVD, PECVD, RTCVD, UHVCVD, LPCVD, MOCVD, and the like.

Figure 14:
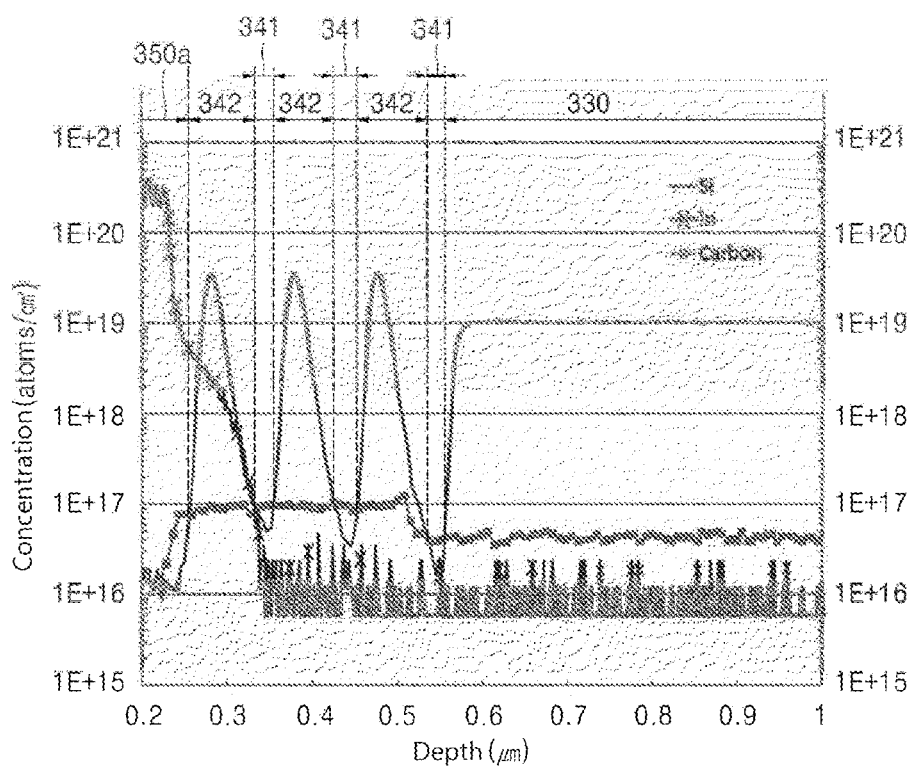
FIG. 14 is a graph depicting concentration distribution in a current spreading part of the lateral type nitride semiconductor light emitting device according to the third embodiment of the present invention.

FIG. 14 is a graph depicting concentration distribution in the current spreading part of the lateral type nitride semiconductor light emitting device according to the third embodiment of the present invention.

As shown in FIG. 14, each of the first diffusive layer 341 and the second diffusive layer 342 is formed of a nitride layer containing carbon as the current spreading impurities and the silicon dopant. The first diffusive layer 341 and the second diffusive layer 342 may be formed by MOCVD using a mixture of a carbon (C)-containing gas and a silicon (Si)-containing gas including $NH_3$, trimethylgallium (TMG), and DMHY (dimethylhydrazine). In addition, the first diffusive layer 341 and the second diffusive layer 342 may be formed in-situ.

Further, referring to FIG. 14, the silicon (Si) dopant may be implanted by delta doping, by which the concentration of the silicon dopant periodically varies in the current spreading part.

Here, the carbon (C) content and the silicon (Si) content of the mixture are adjusted to increase the carbon (C) content such that the first diffusive layer 341 having a higher carbon (C) concentration is initially formed. Thereafter, in a final stage in the process of forming the first diffusive layer 341, the silicon (Si) content of the mixture is increased to form the second diffusive layer 342 having a higher silicon (Si) concentration than the carbon (C) concentration in-situ.

Specifically, the first diffusive layer 341 may contain carbon (C) in a concentration range from $1 \times 10^{16}$ atoms/cm$^3$ to $1 \times 10^{18}$ atoms/cm$^3$, and may have a thickness of 0.04 µm to 0.08 µm.

Selectively, the concentrations of carbon (C) and silicon (Si) may be adjusted by adjusting implantation amounts of carbon (C) and silicon (Si) through repeated in-situ ion implantation as well as MOCVD.

As such, formation of the first diffusive layer 341 and the second diffusive layer 342 may be repeatedly performed in-situ while adjusting the concentrations of carbon (C) and silicon (Si) in MOCVD equipment. As a result, the current spreading part 340 may have a stack structure wherein pluralities of first and second diffusive layers 341, 342 are repeatedly stacked one above another.

Figure 12:
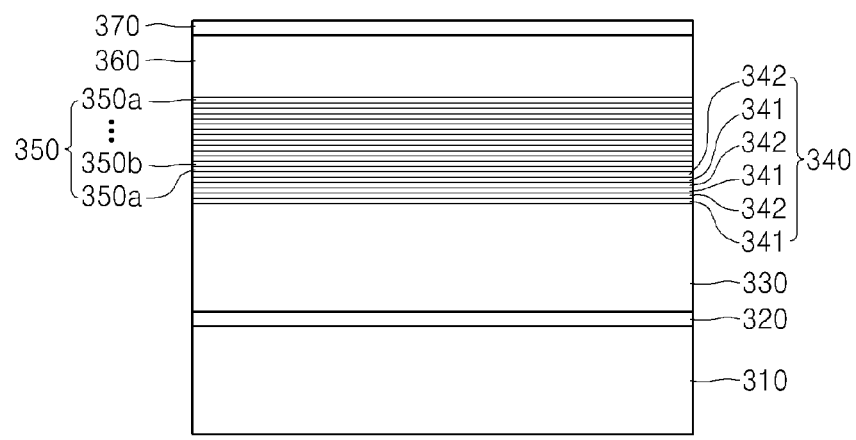

After the current spreading part 340 of the stack structure is formed, an activation layer 350, a p-type nitride layer 360 and a transparent electrode layer 370 are sequentially formed on an upper surface of the current spreading part 340, as shown in FIG. 12.

The activation layer 350 may have a single quantum well structure or a multi-quantum well structure in which quantum well layers and quantum barrier layers are alternately stacked one above another. In this embodiment, the activation layer 350 may have a multi-quantum well structure wherein quantum barrier layers 350a may be formed of, for example, an Al-containing quaternary nitride layer of AlGaInN and quantum well layers 350b may be formed of, for example, InGaN.

The p-type nitride layer 360 may be formed in a stack structure by alternately stacking, for example, a first layer formed of p-type AlGaN doped with Mg and a second layer formed of p-type GaN doped with Mg. In addition, like the n-type nitride layer 330, the p-type nitride layer 360 may be formed by growing a single p-type nitride layer.

The transparent electrode layer 370 is formed of at least one transparent conductive oxide selected from among, for example, ITO, CIO, ZnO, NiO, and In$_2$O$_3$.

Figure 13:
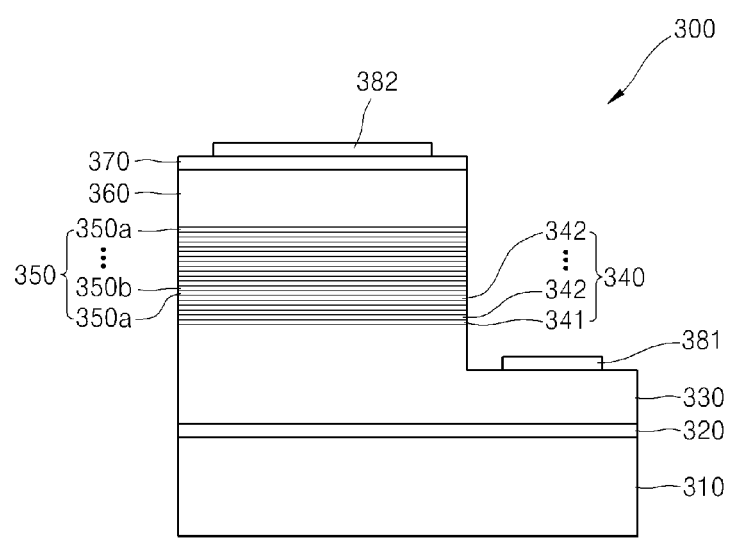

After the transparent electrode layer 370 is formed, one region of the n-type nitride layer 330 may be exposed through lithographic etching and cleaning from the transparent electrode layer 370 to one region of the n-type nitride layer 330, as shown in FIG. 13.

After one region of the n-type nitride layer 330 is exposed, a p-side electrode 382 is formed on an upper surface of the transparent electrode layer 370 and an n-side electrode 381 is formed on the exposed region of the n-type nitride layer 330.

In the method for manufacturing the nitride semiconductor light emitting device 300 according to the third embodiment of the invention, the current spreading part 340 having the stack structure of the first and second diffusive layers 341, 342 repeatedly stacked one above another can be easily formed in-situ. In particular, in the method for manufacturing the nitride semiconductor light emitting device 300 according to the third embodiment, the first diffusive layers 341 and the second diffusive layers 342 can be formed in-situ while adjusting the concentrations of carbon (C) and the silicon (Si) dopant.

Accordingly, the method for manufacturing the nitride semiconductor light emitting device 300 according to the third embodiment allows easy formation of the current spreading part 340 which spreads electric current instead of crowding at a certain region.

Figure 15:
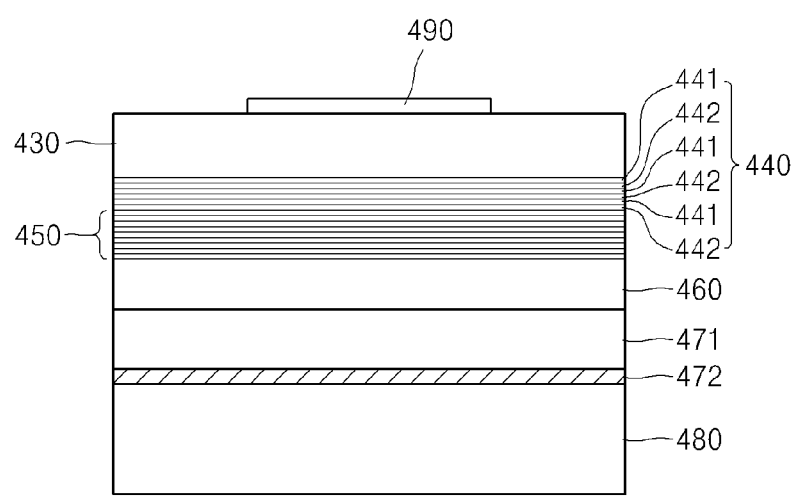
FIG. 15 is a sectional view of a vertical type nitride semiconductor light emitting device according to a fourth embodiment of the present invention.

Hereinafter, a vertical type nitride semiconductor light emitting device according to a fourth embodiment of the present invention will be described with reference to FIG. 15. FIG. 15 is a sectional view of the vertical type nitride semiconductor light emitting device according to the fourth embodiment. Here, detailed descriptions of components and functions of the nitride semiconductor light emitting device apparent to those skilled in the art will be omitted for clarity.

Referring to FIG. 15, like the vertical type nitride semiconductor light emitting device shown in FIG. 8, the vertical type nitride semiconductor light emitting device according to the fourth embodiment of the invention includes, in an upward direction, a p-side electrode support layer 480, a reflective layer 472, an ohmic contact layer 471, a p-type nitride layer 460, an activation layer 450, a current spreading part 440, an n-type nitride layer 430, and an n-side electrode 490, wherein the current spreading part 440 has a stack structure of a first diffusive layer 441 and a second diffusive layer 442 stacked one above another.

The p-side electrode support layer 480 is a conductive support member and is required to ensure sufficient dissipation of heat generated upon operation of the light emitting device while acting as a p-side electrode. Further, the p-side electrode support layer 480 is required to have mechanical strength and support layers to be formed on or above the support layer during a manufacture process including a scribing or breaking process.

Thus, the p-side electrode support layer 480 may be formed of a metal having good thermal conductivity, such as gold (Au), copper (Cu), silver (Ag), aluminum (Al), and the like. Alternatively, the p-side electrode support layer 480 may be formed of alloys, which have crystal structures and crystal lattice parameters similar to these metals to minimize generation of internal stress upon alloying and have mechanical strength. For example, the p-side electrode support layer 480 may be formed of alloys including a lightweight metal, such as nickel (Ni), cobalt (Co), platinum (Pt), palladium (Pd), and the like.

The reflective layer 472 may be optionally formed on an upper surface of the p-side electrode support layer 480 and may be formed of a metallic material having high reflectivity to reflect light upwards when emitted from the activation layer 450.

The ohmic contact layer 471 is formed of a metal, such as nickel (Ni) or gold (Au), or a nitride containing such a metal on an upper surface of the reflective layer 472, and forms ohmic contact having low resistance. Here, when the ohmic contact layer 471 is formed of a metal such as nickel (Ni) or gold (Au), the ohmic contact layer 471 provides a reflecting function, and thus, the reflective layer 472 may be omitted.

The current spreading part 440 has a stack structure formed by alternately stacking first diffusive layers 441 formed of a nitride layer having a carbon (C) concentration higher than silicon (Si) dopant concentration and second diffusive layers 442 having a silicon (Si) dopant concentration higher than carbon (C) concentration in a direction to a lower surface of the n-type nitride layer 430. In this embodiment, the stack structure of the current spreading part 440 is formed by stacking the first and second diffusive layers three times.

In this embodiment, the current spreading part 440 may have a thickness of 500 Å to 5000 Å. Particularly, in the current spreading part 440, the first diffusive layer 441 may have a thickness of 0.04 µm to 0.08 µm.

Of course, the stack structure of the current spreading part 440 may be obtained by stacking the first diffusive layer 441 and the second diffusive layer 442 once, or by stacking the first diffusive layers 441 and the second diffusive layers 442 plural times.

Here, in the current spreading part 440, the current spreading impurities may include carbon as an insulator for current spreading. The current spreading impurities may be contained in a concentration range from $1\times10^{16}$ atoms/cm$^3$ to $1\times10^{18}$ atoms/cm$^3$.

In this way, the current spreading part 440 comprised of the first diffusive layer 441 and the second diffusive layer 442 has alternating concentrations of carbon (C) and the silicon (Si) dopant. With such characteristics, resistance at an interface between the first diffusive layer 441 and the second diffusive layer 442 is lower than resistance in a vertical direction from the current spreading part 440 to the activation layer 450.

Accordingly, the vertical type nitride semiconductor light emitting device according to the fourth embodiment of the invention has improved current distribution along the interface between the first diffusive layer 441 and the second diffusive layer 442 in the current spreading part 440, that is, improved horizontal current distribution.

As the horizontal current distribution is improved, the vertical type nitride semiconductor light emitting device enables uniform inflow of electrons into the activation layer 450 and thus has an increased light emitting area, thereby improving luminous efficacy.

Such a vertical type nitride semiconductor light emitting device may be formed by a typical method for manufacturing a vertical type nitride semiconductor light emitting device. In this case, the vertical type nitride semiconductor light emitting device may be formed by equipment (not shown) for vapor epitaxy growth through a vapor epitaxy growth process using a mixture of a carbon (C)-containing gas and a silicon (Si)-containing gas.

In this case, the current spreading part 440 of the vertical type nitride semiconductor light emitting device may be formed by the same process as that of the current spreading part 340 according to the third embodiment of the invention.

Thus, in the fourth embodiment, the current spreading part 440 having the stack structure comprised of the first diffusive layer 441 having a higher carbon (C) concentration and the second diffusive layer 442 having a higher concentration of the silicon (Si) dopant may be formed in-situ. The vertical type nitride semiconductor light emitting device, which includes the current spreading part 440 formed in-situ, provides uniform current density through the current spreading part 440 and thus has improved luminous efficacy.

Although some embodiments have been disclosed, it should be understood that these embodiments are provided for illustration only and are not to be construed in any way limiting the present invention.

In addition, it can be understood by those skilled in the art that various modifications can be made without departing from the spirit and scope of the present invention.

The invention claimed is:

1. A nitride semiconductor light emitting device comprising:
   an n-type nitride layer;
   a current spreading part formed of a nitride including current spreading impurities and disposed on the n-type nitride layer;
   an activation layer formed on the current spreading part; and
   a p-type nitride layer formed on the activation layer, wherein the current spreading impurities comprise carbon (C), and the current spreading part is formed by doping the current spreading impurities together with a silicon dopant.

2. The nitride semiconductor light emitting device according to claim 1, wherein the silicon dopant is doped in a delta doping form.

3. The nitride semiconductor light emitting device according to claim 1, wherein a thickness of the current spreading part is inversely proportional to a concentration of the current spreading impurities.

4. The nitride semiconductor light emitting device according to claim 1, wherein the current spreading part is a nitride layer having a free hole concentration of $1\times10^{13}$/cm$^3$ to $5\times10^{16}$/cm$^3$ and guiding holes introduced into the activation layer.

5. The nitride semiconductor light emitting device according to claim 1, wherein the current spreading part has a higher carbon concentration than at least one of the n-type nitride layer, the activation layer or the p-type nitride layer.

6. The nitride semiconductor light emitting device according to claim 1, wherein the current spreading part is a nitride layer having a higher carbon concentration than the activation layer or the n-type nitride layer.

7. A method for manufacturing a nitride semiconductor light emitting device, comprising:
   forming an n-type nitride layer on a substrate;
   forming a current spreading part on the n-type nitride layer;
   forming an activation layer on the current spreading part; and
   forming a p-type nitride layer on the activation layer, wherein the current spreading part is formed of a nitride comprising current spreading impurities, the current spreading impurities comprise carbon (C), and the current spreading part is formed by doping the current spreading impurities together with a silicon dopant.

8. The method for manufacturing a nitride semiconductor light emitting device according to claim 7, wherein the silicon dopant is doped in a delta doping form.

9. The method for manufacturing a nitride semiconductor light emitting device according to claim 7, wherein the current spreading part has a higher carbon concentration than the activation layer or the n-type nitride layer.

10. The method for manufacturing a nitride semiconductor light emitting device according to claim 7, wherein the current spreading part has a higher carbon concentration than the n-type nitride layer, the activation layer or the p-type nitride layer.

11. The method for manufacturing a nitride semiconductor light emitting device according to claim 7, wherein a thickness of the current spreading part is inversely proportional to a concentration of the current spreading impurities.

12. The method for manufacturing a nitride semiconductor light emitting device according to claim 7, wherein the current spreading impurities are contained in a concentration of $1\times10^{16}$ atoms/cm$^3$ to $1\times10^{18}$ atoms/cm$^3$ and the current spreading part has a thickness of 500 Å to 5000 Å.

13. A nitride semiconductor light emitting device comprising:
   an n-type nitride layer;
   a current spreading part formed on the n-type nitride layer and containing current spreading impurities and a silicon (Si) dopant;
   an activation layer formed on the current spreading part;
   a p-type nitride layer formed on the activation layer, wherein the current spreading impurities comprise carbon (C), and the current spreading part has a multilayer structure formed by alternately stacking a layer having a higher carbon (C) concentration than silicon (Si) concentration and a layer having a higher silicon (Si) concentration than carbon (C) concentration.

14. The nitride semiconductor light emitting device according to claim 13, wherein a thickness of the current spreading part is inversely proportional to a concentration of the current spreading impurities.

15. The nitride semiconductor light emitting device according to claim 13, wherein the current spreading part comprises carbon (C) contained in a concentration range from $1\times10^{16}$ atoms/cm$^3$ to $1\times10^{18}$ atoms/cm$^3$ and has a total thickness of 500 Å to 5000 Å.

16. The nitride semiconductor light emitting device according to claim 13, wherein electrons emitted from the n-type nitride layer are moved into the activation layer while spreading along an interface between the n-type nitride layer and the current spreading part.

17. A method for manufacturing a nitride semiconductor light emitting device, comprising:
   forming an n-type nitride layer on a substrate;
   forming a current spreading part of a multilayer structure containing current spreading impurities and a silicon (Si) dopant on the n-type nitride layer;
   forming an activation layer on the current spreading part; and
   forming a p-type nitride layer on the activation layer,
   wherein the current spreading impurities comprise carbon (C), and the current spreading part is formed by alternately stacking a layer having a higher carbon (C) concentration than silicon (Si) concentration and a layer having a higher silicon (Si) concentration than carbon (C) concentration.

18. The method for manufacturing a nitride semiconductor light emitting device according to claim 17, wherein the forming a current spreading part comprises:
   forming a nitride layer having a higher carbon (C) concentration than silicon (Si) dopant concentration by vapor epitaxy growth using a mixture of a carbon (C)-containing gas and a silicon (Si) dopant-containing gas; and
   forming a nitride layer having a higher silicon (Si) dopant concentration than carbon (C) concentration on the nitride layer having a higher carbon (C) concentration than the silicon (Si) dopant concentration by vapor epitaxy growth, the nitride layers being alternately stacked once or more by an in-situ manner to form the current spreading part.

19. The method for manufacturing a nitride semiconductor light emitting device according to claim 17, wherein the forming a current spreading part comprises:
   forming a nitride layer having a higher carbon (C) concentration than silicon (Si) dopant concentration by adjusting implantation amounts of carbon (C) and the silicon (Si) dopant through ion implantation to the nitride layer; and
   forming a nitride layer having a higher silicon (Si) dopant concentration than carbon (C) concentration on the nitride layer having a higher carbon (C) concentration than the silicon (Si) dopant concentration through ion implantation, the nitride layers being alternately stacked once or more by an in-situ manner to form the current spreading part.

20. The method for manufacturing a nitride semiconductor light emitting device according to claim 17, wherein the current spreading part comprises carbon (C) in a density range from $1\times10^{16}$ atoms/cm$^3$ to $1\times10^{18}$ atoms/cm$^3$ and has a total thickness of 500 Å to 5000 Å.

\* \* \* \* \*